(12) United States Patent
Delahoy et al.

(10) Patent No.: US 7,235,160 B2
(45) Date of Patent: Jun. 26, 2007

(54) HOLLOW CATHODE SPUTTERING APPARATUS AND RELATED METHOD

(75) Inventors: Alan E. Delahoy, Rocky Hill, NJ (US); Sheyu Guo, Wallingford, PA (US)

(73) Assignee: Energy Photovoltaics, Inc., Lawrenceville, NJ (US)

( * ) Notice: Subject to any disclaimer, the term of this patent is extended or adjusted under 35 U.S.C. 154(b) by 167 days.

(21) Appl. No.: 10/635,344

(22) Filed: Aug. 6, 2003

(65) Prior Publication Data
US 2005/0029088 A1 Feb. 10, 2005

(51) Int. Cl.
*C23C 14/35* (2006.01)
(52) U.S. Cl. .......................... 204/192.12; 204/192.15; 204/192.22; 204/192.23; 204/298.07; 204/298.12; 204/298.18
(58) Field of Classification Search ........... 204/192.12, 204/192.15, 192.22, 192.23, 298.12, 298.07, 204/298.18, 298.09
See application file for complete search history.

(56) References Cited

U.S. PATENT DOCUMENTS

| | | | | |
|---|---|---|---|---|
| 5,810,982 A | * | 9/1998 | Sellers | 204/298.08 |
| 5,889,295 A | * | 3/1999 | Rennie et al. | 257/96 |
| 6,150,030 A | * | 11/2000 | Stollenwerk et al. | 428/432 |
| 6,156,172 A | * | 12/2000 | Kadokura | 204/298.26 |
| 6,337,001 B1 | | 1/2002 | Haag et al. | 204/192.2 |
| 6,458,253 B2 | * | 10/2002 | Ando et al. | 204/192.15 |

FOREIGN PATENT DOCUMENTS

DE 42 35 953 A1 4/1994

OTHER PUBLICATIONS

Vossen et al., "Thin Film Processes", p. 48-49 (1978).*
"Deposition Schemes for Low Cost Transparent Conductors for Photovoltaics", A. E. Delahoy & M. Cherny, Mat. Res. Symp. Proc., vol. 426, 1996, pp. 467-477.
"High-Rate Low Kinetic Energy Gas-Flow-Sputtering System", K. Ishii, J. Vac. Sci. Technol. A, vol. 7, No. 2, 1989, pp. 256-258.
"Hollow Cathode Discharge Sputtering Device for Uniform Large Area Thin Film Deposition", H. Koch, J. Vac. Sci. Technol. A., vol. 9, No. 4, 1991, pp. 2374-2377.

(Continued)

*Primary Examiner*—Rodney G. McDonald
(74) *Attorney, Agent, or Firm*—Brooks Kushman, P.C.

(57) ABSTRACT

The present invention provides an improved hollow cathode method for sputter coating a substrate. The method of the invention comprises providing a channel for gas to flow through, the channel defined by a channel defining surface wherein one or more portions of the channel-defining surface include at least one target material. Gas is flowed through the channel wherein at least a portion of the gas is a non-laminarly flowing gas. While the gas is flowing through the channel a plasma is generated causing target material to be sputtered off the channel-defining surface to form a gaseous mixture containing target atoms that is transported to the substrate. In an important application of the present invention, a method for forming oxide films and in particular zinc oxide films is provided.

52 Claims, 9 Drawing Sheets

Non-laminar gas flow (for small gap cathodes)

OTHER PUBLICATIONS

"Zirconia Thin Film Deposition on Silicon by Reactive Gas Flow Sputtering: The Influence of Low Energy Particle Bombardment", T. Jung & A. Westphal, Mater. Sci. Eng., A140, 1991, pp. 528-533.

"High Rate Deposition of Alumina Films by Reactive Gas Flow Sputtering", T. Jung & A. Westphal, Surf. Coat. Technol., 59, 1993, pp. 171-176.

"Gas Flow Sputtering of Oxide Coatings: Practical Aspects of the Process", Th. Jung, T. Kälber, V.v.d. Heide, Surf. Coat. Technol., 86-87, 1996, pp. 218-224.

"New DC Sputter Sources for the Large Scale Deposition of Oxide Films", M. Höfer, A. Jung, T. Jung, H.-U. Kricheldorf & F. Schmidt, Proc. 43$^{rd}$ SVC Annual Tech. Conf., 2000, pp. 287-292.

* cited by examiner (a) laminar gas flow (b) laminar gas flow (c) Non-laminar gas flow (for small gap cathodes)

(d) Non-laminar gas flow (for large gap cathodes)

HOLLOW CATHODE SPUTTERING APPARATUS AND RELATED METHOD

BACKGROUND OF THE INVENTION

1. Field of the Invention

The present invention is related to methods and related apparatus for depositing films on a substrate by hollow cathode sputtering. More particularly, the present invention relates to methods and apparatus for depositing oxide and other films by hollow cathode sputtering.

2. Background Art

Numerous methods are known for depositing thin films on a substrate. Such methods include, for example, sputtering, vacuum evaporation, chemical vapor deposition, and the like. Typical substrates that are coated with thin films are glass, ceramics, and silicon wafers. Vacuum evaporation is a low pressure deposition technique in which a material is vaporized by heating. Vacuum evaporation is a line of sight deposition technique in which the vaporized material is then radiated out in straight lines from the source. Chemical vapor deposition is a thin film deposition technique in which a reactive gaseous mixture is heated over a substrate. The elevated temperature causes a chemical reaction to occur from which a desired film is formed. Chemical vapor deposition can be undesirable because of contamination of the deposited films.

Sputtering is a low pressure deposition process in which a plasma containing gas ions and electrons is created by the action of an electric field on gas that is introduced into a deposition chamber. The electric field may be formed by either a dc or rf voltage bias. These ions are accelerated towards a target from which material is removed. This removed material is ultimately deposited on a nearby substrate. Reactive sputtering is a further refinement of the sputtering process in which a reactive gas such as nitrogen, oxygen, hydrogen, $H_2O$, $H_2Se$, $CH_4$, $C_2H_6$, $C_2H_2$, $C_2H_4$, $B_2H_6$, $PH_3$, $CCl_4$, $CF_4$, organic monomers like HMDSO, pyrrole and the like are introduced into the deposition chamber. These reactive gases are capable of reacting with the removed target material to form a compound film on the substrate. Accordingly, these reactive gases provide one or more atoms that are incorporated into the film. Reactive sputtering is particularly useful for depositing doped and undoped metal oxides, nitrides, carbides, and the like. However, care must be taken in the reactive sputtering process because such reactive gases may form an insulating layer on the conductive target thereby reducing film growth rate.

The effect of insulating layers on the targets in the sputtering process is generally alleviated by the use of RF power to form the plasma. This type of sputtering is referred to as RF sputtering. It is particularly useful for depositing both insulating and oxide films, but deposition rates tend to be low. In the RF sputtering process, a substrate is placed between two electrodes which are driven by an RF power source. Superimposed on this applied RF field is a DC potential. This DC potential advantageously drives the ions toward the target causing some of the target material to be removed. This removed target material may then react with a reactive gas. Again the removed material ultimately coats the substrate.

A number of sputtering refinements makes this technique even more desirable for the deposition of insulating and oxide films. These refinements include unbalanced magnetron sputtering, the utilization of pulsed dc power, and the use of hollow cathodes. The utilization of hollow cathode sputtering in a gas flow mode is a relatively new technique in which an inert gas such as argon is introduced into a channel in a target cathode. While contained within this channel a plasma is formed that removes atoms from the target. These atoms are eventually swept by the gas flow out of the cathode at which point they may then be reacted with a reactive gas. The continuous flow of the inert gas prevents (or tends to prevent) the reactive gas from entering the cathode and thereby prevents (or tends to prevent) an insulating layer from forming on the target. Although the prior art hollow cathode processes may inhibit the formation of an insulating layer on the target, these processes tend to produce films at unacceptably low growth rates.

Accordingly, there exists a need for improved sputtering methods for depositing thin films and in particular insulating or oxide thin films with high growth rates and reduced formation of insulating layers on the targets used in such sputtering processes.

SUMMARY OF THE INVENTION

The present invention overcomes the problems of the prior art by providing in one embodiment an improved method for sputter coating a substrate. The method of the invention is a hollow cathode sputtering process which comprises providing a channel for gas to flow through, the channel defined by a channel defining surface wherein one or more portions of the channel-defining surface includes at least one target material. Gas is flowed through the channel wherein at least a portion of the gas is a non-laminarly flowing gas. While the gas is flowing through the channel a plasma is generated causing target material to be sputtered off the channel-defining surface to form a gaseous mixture containing target atoms that are transported to the substrate. In an important application of the present invention, a method for forming oxide films and in particular zinc oxide films is provided.

In another embodiment of the present invention, a sputter-coating system for coating a substrate is provided. Such a sputter-coating system will include at least one target material, an electrode having a channel-defining surface, and a source of non-laminarly flowing working gas. The channel-defining surface contains the target material. During operation of the sputter-coating system, a plasma is generated causing the at least one target material to be sputtered off the channel-defining surface. This in turn causes a gaseous reactive composition to form which is subsequently transported to the substrate.

The source of non-laminarly flowing gas includes a series of orifices such that at least two gas streams emerging from the series of orifices are substantially flowing in non-parallel directions. The source of non-laminarly flowing gas includes a series of adjacent orifices that direct the gas in non-parallel directions. The channel defining surface will typically be part of the cathode. Moreover, the channel is characterized by a generally rectangular cross section. The sputter-coating system may have a first target material and a second target material. The first target material is preferably opposite the second where the first target material and the second target material are the same or different. In such a configuration, the two target materials will form at least a portion of the side walls of the channel-defining surface, and in particular the side walls that make up the wider sides when the channel has a rectangular cross section. Moreover, the at least one target material optionally includes a third target material and a fourth target material. The third target material being opposite the fourth target material. In this instance, the first target material, the second target material, the third target material, and the fourth target material may be the same or different. The target material, which is typically part of the cathode, is in electrical contact with a DC potential or a DC potential with a superimposed AC potential. Moreover, the at least one target material comprises a metal or metal alloy. Suitable target materials include, but are not limited to, zinc, copper, aluminum, silicon, tin, indium, magnesium, titanium, chromium, molybdenum, nickel, yttrium, zirconium, niobium, cadmium, and mixtures thereof. The sputter-coating system of the present invention further comprises a source of a reactive gas which is located at proximate position to the exit of the channel.

DETAILED DESCRIPTION OF THE PREFERRED EMBODIMENT(S)

Reference will now be made in detail to presently preferred compositions or embodiments and methods of the invention, which constitute the best modes of practicing the invention presently known to the inventors.

Figure 1:
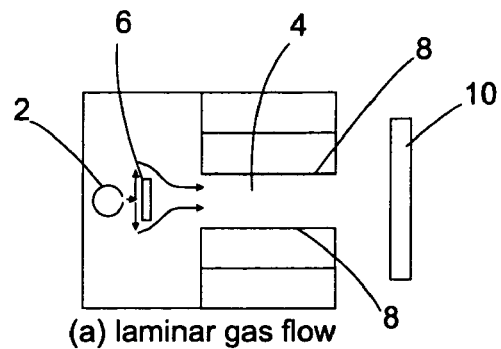
FIG. 1A is a schematic demonstrating laminar gas flow in a hollow cathode with a baffle between the gas nozzle and the channel defined by the target materials.
FIG. 1B is a schematic demonstrating laminar gas flow in a hollow cathode with the gas nozzle between the baffle and the channel defined by the target materials.
FIG. 1C is a schematic demonstrating the utilization of non-laminar gas flow in a hollow cathode by creating a narrow passage between the gas nozzle and the target materials.
FIG. 1D is a schematic demonstrating the utilization of non-laminar gas flow in a hollow cathode by directing the gas flow into non-parallel directions.
Figure 1:
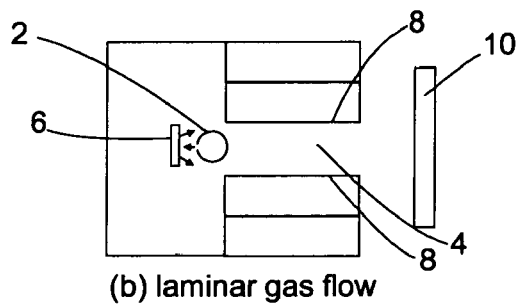
Figure 1:
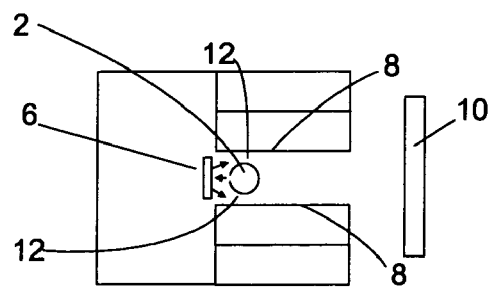
Figure 1:
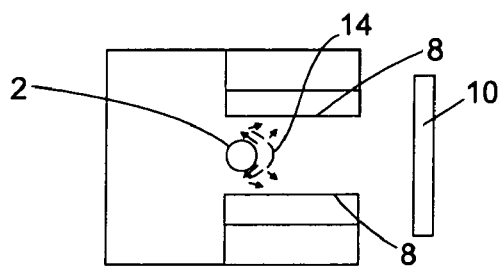
Figure 2:
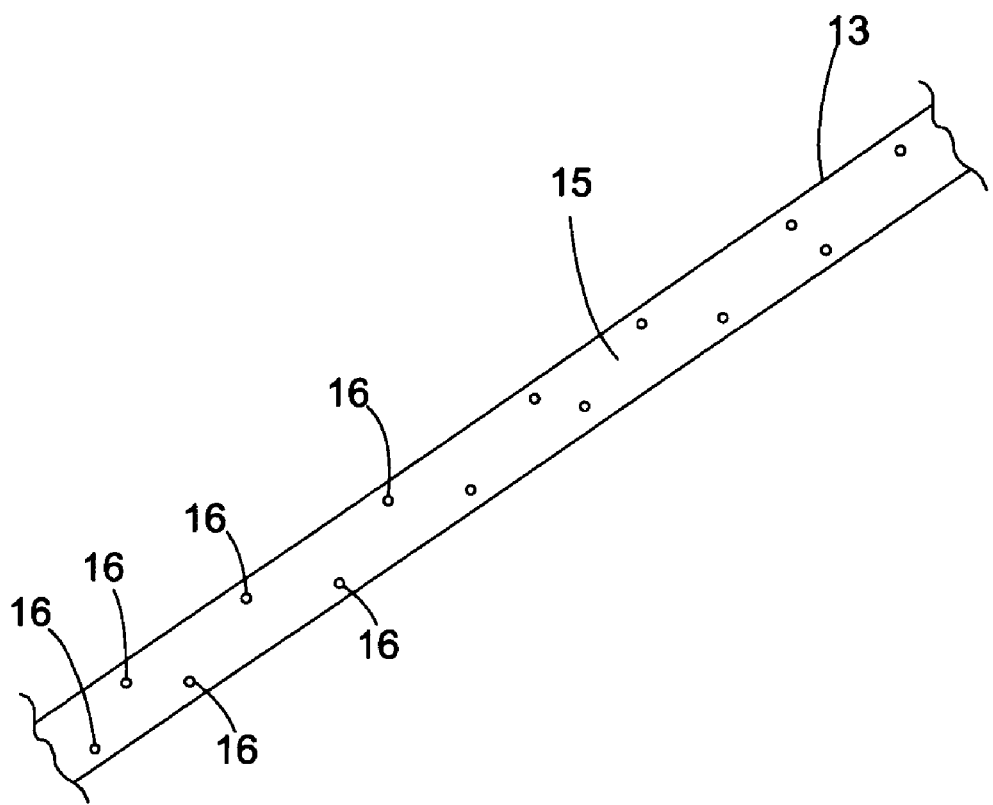
FIG. 2 is a perspective view of a gas nozzle which introduces a gas with non-parallel directions into the channel.

In one embodiment of the present invention, a method for sputter coating a substrate utilizing a hollow cathode in a sputter coating reactor is provided. The method of the invention comprises providing a channel (i.e., a cathode channel) for gas to flow through, the channel defined by a channel defining surface wherein one or more portions of the channel-defining surface include at least one target material. Typically, the channel defining surface is part of the cathode of a sputtering system and has a rectangular cross section. Gas is flowed through the channel wherein at least a portion of the gas is a non-laminarly flowing gas. Preferably, this gas will be an inert gas such as argon. Such inert gases are sometimes referred to as working gases in that these gases are used to sputter off material from target surfaces. FIGS. 1 A through D are schematics illustrating laminar flow and the methods of the present invention. With reference to FIGS. 1A and B, gas is introduced from nozzle 2 into channel 4. Prior to entering channel 4, the gas impinges on baffle 6 which helps in mixing. While the gas is flowing through channel 4 a plasma is generated causing target material to be sputtered off the channel-defining surface 8 to form a gaseous mixture containing target atoms that are transported to substrate 10. With reference to FIG. 1C, a configuration suitable for small gap cathodes is provided. In this configuration, non-laminar flow is induced by placing nozzle 2 within channel 4. This causes gas that impinges on baffle 6 to be forced at a relatively higher velocity through narrow passage 12 which is formed between nozzle 2 and channel-defining surfaces 8. The higher velocity gas flow close to the target surface is maintained across the length of the channel from entrance to exit or across at least part of the channel. With reference to FIG. 1D, a configuration that is suitable for large gap cathodes is provided. In this configuration, nozzle 2 is placed in channel 4. Gas emerging from nozzle 2 is forced to flow through flow directing shield 14 which directs the gas in a number of non-parallel directions. It will be appreciated that the flow directing properties of shield 14 may be built directly into nozzle 2 by having orifices in nozzle 2 that direct the gas in non-parallel directions. The requirement that the gas be flowing non-laminarly is important in achieving the advantages of the present invention. A preferred way to achieve non-laminar flow is by inducing turbulence. Typically, turbulent flow is characterized as having a Reynolds number greater than 2000. A slightly different preferred way of achieving non-laminar flow is by having different portions of the gas flow in different directions. In its simplest embodiment of this concept, a first portion of gas in a first direction and a second portion of gas is a second direction wherein the first direction and the second direction are substantially non-parallel. With reference to FIG. 2 a perspective view of gas nozzle 13 which introduces a gas into the channel is provided. Typically, the gas will be introduced into a sputtering reactor through a manifold 15 with a series of orifices 16 from which the gas emerges. Accordingly, the non-laminarly flowing gas is formed by flowing the gas through at least two orifices such that at least two gas streams emerging from the at least two orifices are flowing in substantially non-parallel directions. In practice, however, the manifold will contain numerous orifices wherein two adjacent orifices will direct the gas flow in different non-parallel directions.

Figure 3:
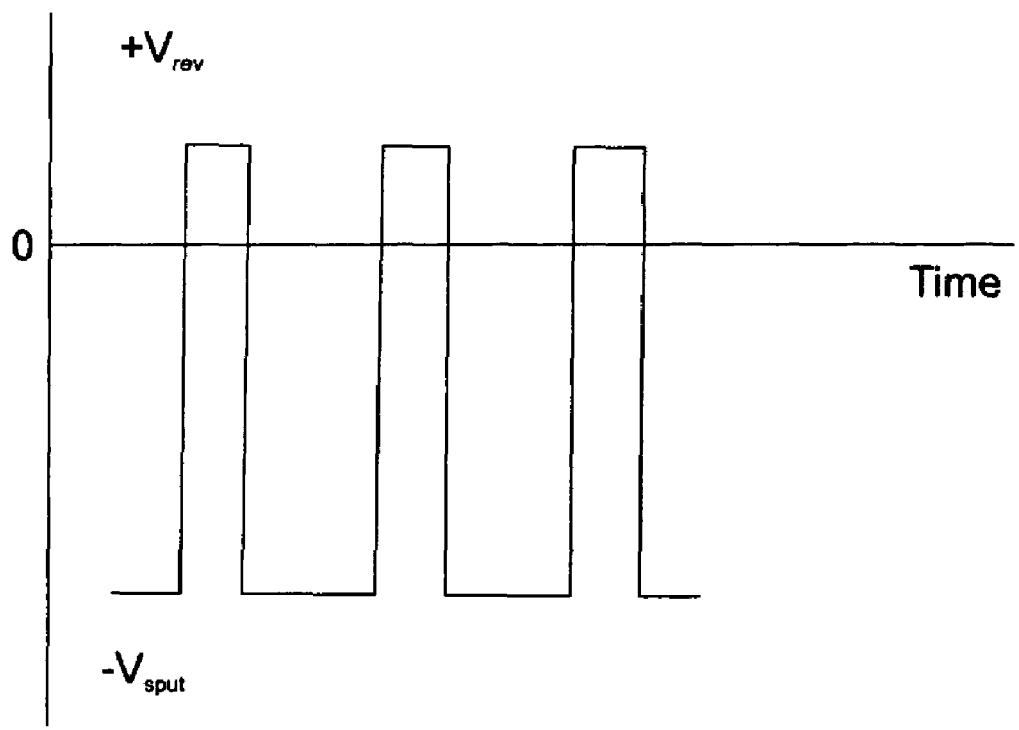
FIG. 3 is a plot of a waveform that may be used to drive a sputtering system with an asymmetric bipolar pulsed DC power supply.

The target material, which is typically part of the cathode, is in electrical contact with a DC potential, a DC potential with a superimposed AC potential, or a pulsed DC potential. The preferred power source is a pulsed DC power source and in particular an asymmetric bipolar pulsed DC power supply. An asymmetric bipolar power is applied between the cathode and anode by adding a reverse (opposite polarity) voltage pulse to the normal (steady negative) DC waveform. The resulting waveform is shown in FIG. 3. Typical sputtering runs at about −400V, so that the positive argon ions accelerate towards the target biased at −400V, striking and sputtering the target (sputtering mode). However, in reactive sputtering, reaction of the gas (oxygen, for example) with the target material can create an insulating film on the target surface. Positive charge from the ions builds up on the film surface and reduces the incoming ion energy because of electrostatic repulsion. This makes it difficult or impossible to remove the oxide since sputtering is effectively prevented. If DC sputtering is attempted, the presence of an insulator on the target surface leads to arcing. Using the bipolar type of supply described above, when the polarity is rapidly reversed to about +100V, the surface charges up to −100V because of the attraction of electrons. Next, upon returning to sputtering mode, −400V is applied to the target and the effective voltage on the surface of the oxide is −500V. Thus, the argon ions are drawn by electrostatic attraction to the insulators, and strike with extra energy. This helps sputter off the insulators, reducing target poisoning. The frequency normally used is from 50 kHz to 250 kHz. The reverse pulse width can be set anywhere between 0 and 40% of the pulse's duty cycle. Depending on the target material and the rate of oxide formation, the use of asymetric bipolar pulsed power may only have limited effectiveness in removal of insulating layers. Even with the flow of inert gas through the cathode (laminar or non-laminar), some backstreaming of the reactive gas (oxygen, say) may occur and partially oxidize the target surface. Asymmetric bipolar pulsed DC supplies usually have low energy storage which also reduces arcing. A similar benefit occurs when a new target is being run for the first time (burn-in). The time required to stabilize the discharge is decreased, resulting in faster burn-in. Depending on the power supply manufacturer, the pulse shape may not be rectangular. This does not affect the principles described.

The at least one target material used in the method of the invention comprises a metal or metal alloy. Suitable target materials include, but are not limited to, zinc, copper, aluminum, silicon, tin, indium, magnesium, titanium, chromium, molybdenum, nickel, yttrium, zirconium, niobium, cadmium, and mixtures thereof.

In a preferred variation of the present invention, the target material includes a first target material and a second target material. The first target material is preferably opposite the second where the first target material and the second target material are the same or different. In such a configuration, the two target materials will form at least a portion of the side walls of the channel-defining surface, and in particular the side walls that make up the wider sides when the channel has a rectangular cross section. Moreover, the at least one target material optionally includes a third target material and a fourth target material. The third target material being opposite the fourth target material. In this instance, the first target material, the second target material, the third target material, and the fourth target material may be the same or different.

Figure 4:
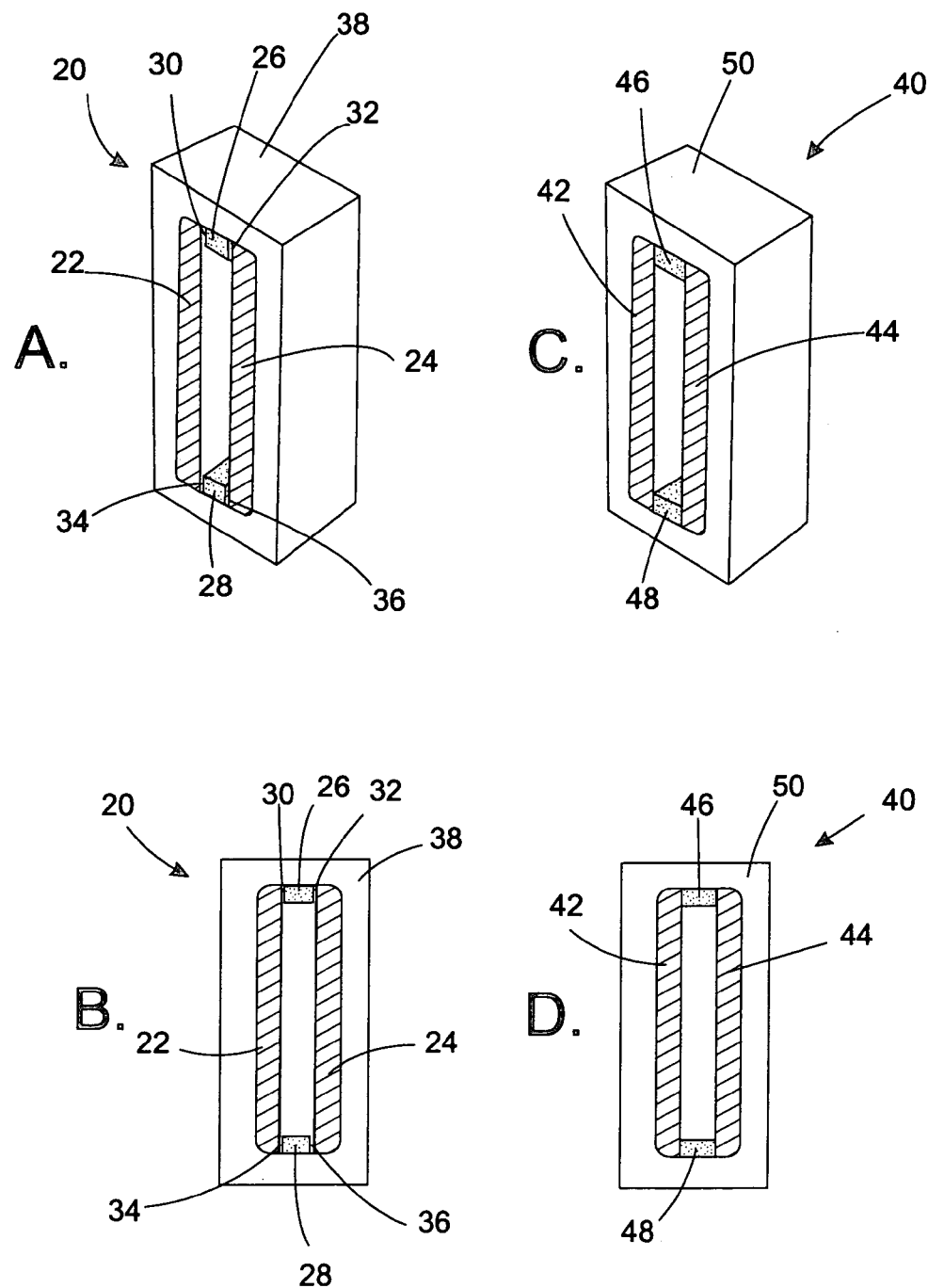
FIG. 4A is a perspective view of a target that is capable of holding up two target materials separated by two insulating blocks.
FIG. 4B is a front view of a target that is capable of holding up two target materials separated by two insulating blocks.
FIG. 4C is a perspective view of a target that is capable of holding up four target materials.
FIG. 4D is a perspective view of a target that is capable of holding up four target materials.

FIGS. 4A through D provide schematics of a water-cooled Cu cathode fitted with four target pieces (two large side pieces and two smaller end blocks). With reference to FIGS. 4A and 4B, a perspective view and a front view of a target that is capable of holding up to two target materials separated by insulating blocks is provided. Target 20 consists of plate 22 and plate 24 with are opposite and face each other. Plate 22 is made from the first target material and plate 24 is made of the second target material. Target 20 also consists of insulating blocks 26, 28 which are opposite and face each other. Insulating end blocks 26, 28 are made from an electrically insulating material such as Macor (a machinable ceramic from Corning). Insulating end blocks 26, 28 are isolated from plates 22, 24 by gaps 30, 32, 34, 36. The gap width for each of gaps 30, 32, 34, 36 is about 0.5 mm to 1.0 mm. Without such gaps, the arcs result from a potential difference between the floating metal film that builds up on the insulator surface during the sputtering process and the target proper. This metal film builds up on the insulator close to the target until a discharge occurs. Once the discharge occurs, arcs continue until the metal film near the target is burned away. This arc-generating process then repeats during thin film deposition. With appropriate sizing of the insulators and target pieces to create a gap, a discharge between the target and a metal film on the insulator cannot occur because of the gap spacing. The insulating end blocks make the film thickness distribution in the direction of the long axis of the slot more uniform than if additionally metal targets are placed there. If a back insulator (not shown) is used on the rear of the cathode for construction purposes, a similar principle is used to create a gap between the back insulator and the target pieces. Without the ceramic end blocks, the thickness distribution strongly peaks near the two ends of the slot. Plates 22, 24 are contained within cooling jacket 38 through which a coolant such as water flows to keep the target materials cooled. This figure shows the water-cooled Cu cathode fitted with four target pieces (two large side pieces and two smaller end blocks). The exit slot defined by the inner surfaces of the target pieces is evident. When all four target pieces are metals, they may butt up against each other as shown.

With reference to FIGS. 4C and 4D, a perspective view and a front view of a target that is capable of holding up to four target materials are provided. Target 40 consists of wide plate 42 and wide plate 44 which are opposite and face each other. Wide plate 42 is made from the first target material and wide plate 44 is made of the second target material. Target 40 also consists of short plate 46 and short plate 48 which are opposite and face each other. Short plate 46 is optionally made from the third target material and short plate 48 is optionally made from the fourth target material. Plates 42, 44, 46, 48 are contained within cooling jacket 50 through which a coolant such as water flows to keep the target materials cooled.

The method of the present invention optionally further includes a step of introducing a reactive gas into the sputter coating reactor. The reactive gas is introduced into the sputter coating reactor at a position located outside of the channel from which the gaseous mixture emerges prior to reaching the substrate. The reactive gas contains an atom selected from the group consisting of oxygen, nitrogen, selenium, sulfur, iodine, hydrogen, carbon, boron, and phosphorus. Suitable reactive gases include, but are not limited to, molecular oxygen, molecular nitrogen, molecular hydrogen, $H_2O$, $H_2Se$, $CH_4$, $C_2H_6$, $C_2H_2$, $C_2H_4$, $B_2H_6$, $PH_3$, $CCl_4$, $CF_4$, HMDSO, pyrrole and mixture thereof.

In a particularly useful application of the method of the present invention, a method for depositing an oxide film on a substrate in a sputter coating reactor is provided. This oxide forming method comprises the following steps:

a) providing a channel for a working gas to flow through, the channel defined by a channel-defining surface wherein one or more portions of the channel-defining surface include at least one target material;

b) flowing the working gas through the channel wherein at least a portion of the working gas flows non-laminarly;

c) generating a plasma wherein a portion of the target material is sputtered off the at least one target material to form a gaseous mixture containing target atoms; and d) introducing into the sputter coating reactor a reactive gas that comprises oxygen, wherein an oxide film is deposited on the substrate. Preferably, the working gas is an inert gas such as argon. The reactive gas is introduced at a position located outside of the channel from which the gaseous mixture emerges prior to reaching the substrate. The at least one target material comprises a metal, metal alloy, or a semiconductor. Examples of useful target materials include, but are not limited to, zinc, copper, aluminum, silicon, tin, indium, magnesium, titanium, chromium, molybdenum, nickel, yttrium, zirconium, niobium, cadmium, and mixtures thereof. Preferred oxide films made by the method include zinc oxide made by using a target which includes zinc and $CrSiO_x$ made from a target that includes both chromium and silicon, wherein x is a number such that the valency of Cr and Si are satisfied or partially satisfied. Transparent electrically conducting oxides that may be made by the method of the present invention include, for example, ZnO:B (boron doped zinc oxide), $CuAlO_2$, $CuBO_2$, $In_2O_3$, $In_2O_3$:Mo (molybdenum doped indium oxide), ITO (indium tin oxide), $Al_2O_3$, or mixtures thereof. In the case of zinc oxide, the target may also include aluminum so that an aluminum doped zinc oxide film (ZnO:Al) is formed. Gallium and indium are also suitable dopants for zinc oxide. In the case of ZnO:B, the source of the boron atoms is conveniently the gas diborane ($B_2H_6$). The diborane may be introduced either externally or internally to the cathode. External introduction avoids target memory effects, and is preferred. In the case of $CuBO_2$, the boron is preferably introduced by flowing a mixture of the working gas and diborane through the cathode. Magnesium oxide and aluminum oxide, which are highly insulating films, may be advantageously made by the method of the invention. In forming oxide films, the reactive gas must necessarily include compounds that have an oxygen atom. Useful examples of such gases include, but are not limited to, molecular oxygen and $H_2O$. The present variation of the method of the invention may include a first, second, third, and fourth target material as set forth above.

In another embodiment of the present invention, a method for depositing a nitride film on a substrate in a sputter coating reactor is provided. The method of this embodiment comprises providing a channel for a working gas to flow through, the channel defined by a channel-defining surface wherein one or more portions of the channel-defining surface include at least one target material. The working gas is then flowed through the channel wherein at least a portion of the working gas flows non-laminarly. While the working gas is flowing, a plasma is generated wherein a portion of the target material is sputtered off the at least one target material to form a gaseous mixture containing target atoms. Finally, a reactive gas comprising molecular nitrogen is introduced into the sputter coating reactor, wherein a nitride film is deposited on the substrate. In one variation of this embodiment the reactive gas is introduced at a position located outside of the channel from which the gaseous mixture emerges. In a particularly preferred variation of this embodiment, the reactive gas is combined with the working gas (e.g. Ar) while it is flowed through the channel (i.e., the cathode channel.) The need to mix the reactive gas and the working gas in the cathode channel is likely due to the lower reactivity of nitrogen gas compared to oxygen. The success may relate to the relatively high electrical conductivity of many metal nitrides. The configuration of the at least one target material is the same as set forth above. For example, the at least one target material includes a first target material and a second target material; and the first target material and the second target material are the same or different. In this configuration, the first target material is preferably opposite the second target material. Moreover, the at least one target material typically comprises a metal, metal alloy, or semiconductor. Preferably, the at least one target material comprises a component selected from the group consisting of zinc, copper, aluminum, silicon, tin, indium, magnesium, titanium, chromium, molybdenum, nickel, yttrium, zirconium, niobium, cadmium, vanadium, hafnium, tungsten, and mixtures thereof. Examples of nitrides that may be made by the method of this embodiment include titanium nitride, indium nitride, aluminum nitride, chromium nitride, vanadium nitride, tungsten nitride, copper nitride, zirconium nitride, or mixtures thereof.

Figure 5A:
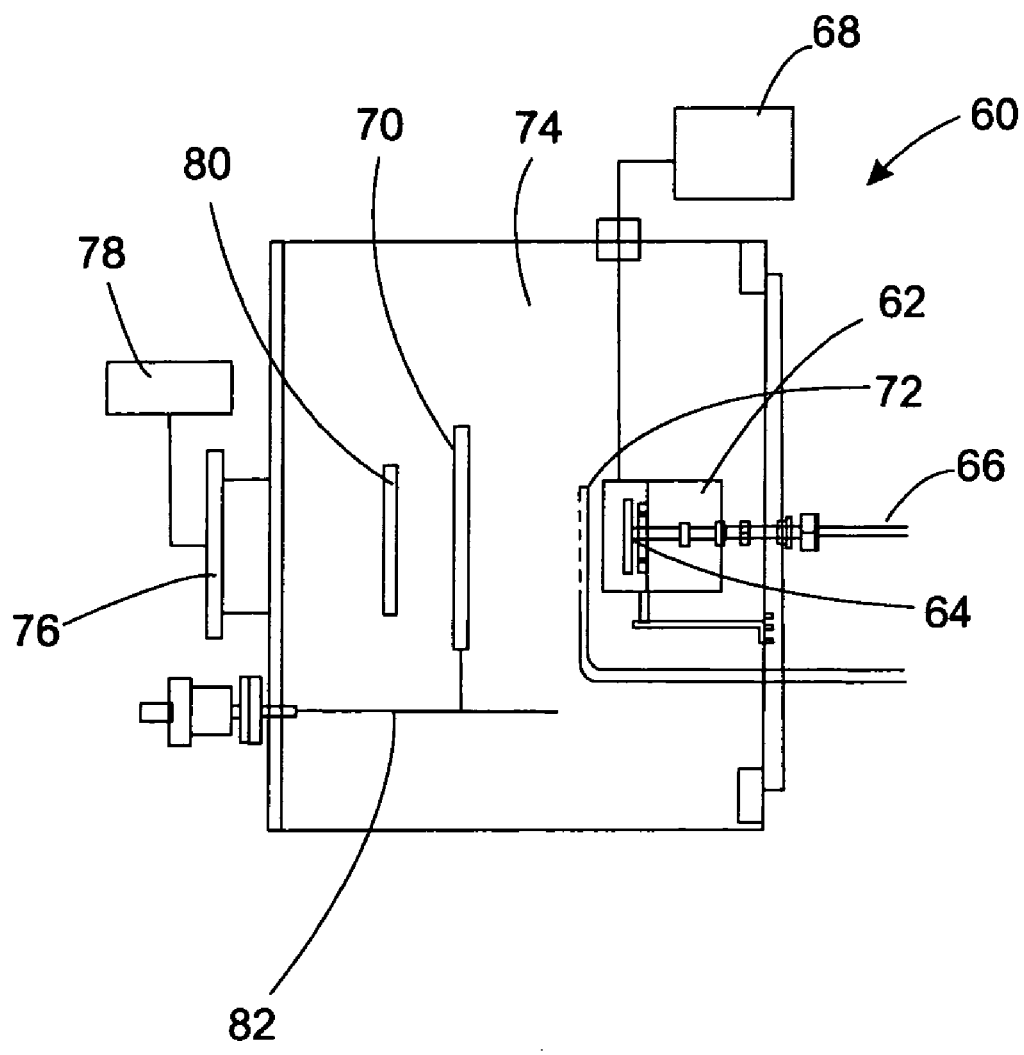
FIG. 5A is a schematic of an embodiment of the sputter-coating system of the present invention.
Figure 5B:
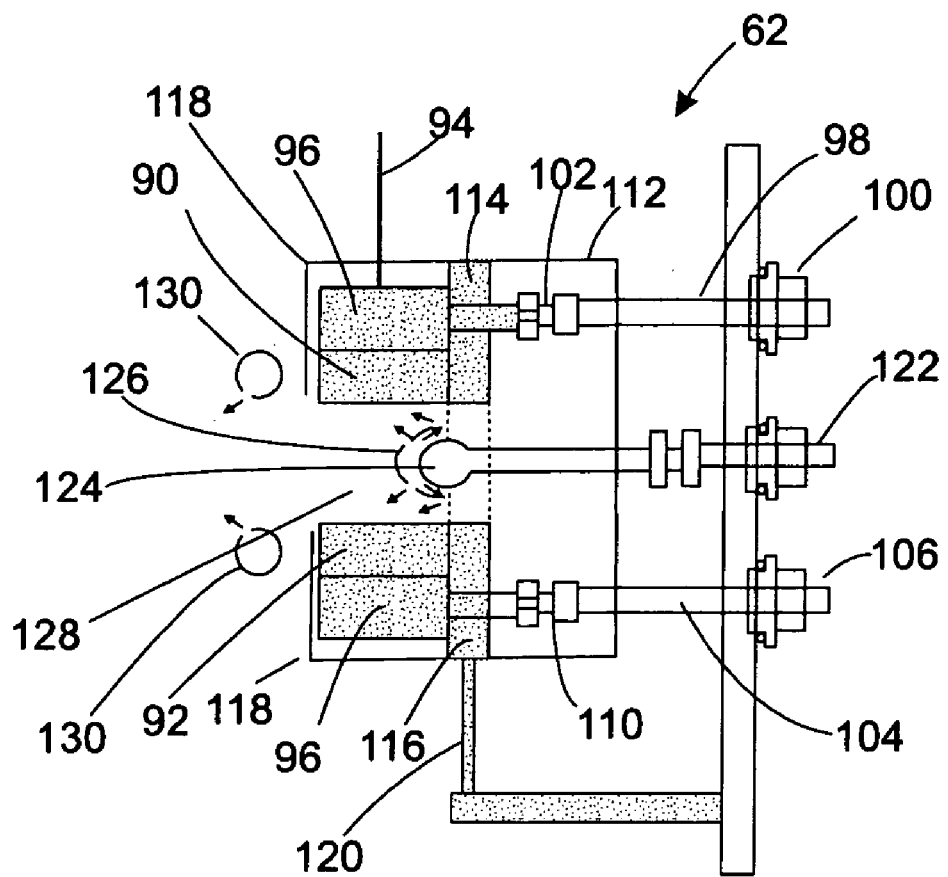
FIG. 5B is a schematic of the cathode used in the sputter-coating system of the present invention.

With reference to FIG. 5A a schematic of the sputter-coating system of the present invention is provided. Sputter system 60 includes cathode 62 into which a non reactive gas such as argon is introduced into injector 64 by tube 66. Cathode 62 is powered by high voltage power supply 68. Within cathode 62 a gaseous mixture containing target atoms as set forth above is formed and transported toward substrate 70. Upon emerging from cathode 62, the gaseous mixture combines with a reactive gas that is introduced from manifold 72. Low pressure is maintained within chamber 74 by the operation of throttle valve 76 and pumping system 78. Moreover, substrate 70 is heated by heating lamps 80 and transported through the sputtering system by transport mechanism 82. With reference to FIG. 5B, a schematic cross-section of cathode 62 is provided. Cathode 62 includes targets 90, 92 which are made of materials as set forth above. Targets 90,92 are powered through electrical feed 94. Cathode 62 is cooled via copper cooling block 96 which is water cooled. Water is introduced into copper cooling block 96 through teflon tube 98 which snakes through leak tight adapter 100. Teflon tube 98 attaches to copper cooling block 96 via connector 102. Similarly, water is removed from copper cooling block 96 through teflon tube 104 which snakes through leak tight adapter 106. Teflon tube 104 attaches to copper cooling block 96 via connector 110. Back section 112 is electrically isolated from cooling section 96 and targets 90, 92 by ceramic insulators 114, 116. Cathode 62 also includes dark shield 118 and ceramic support which holds cathode 62 in place. A non-reactive gas such as argon is introduced into the cathode by inlet 122. The gas then emerges from nozzle 124. Next the gas is redirected by flow directing shield 126 which causes the gas to flow in non-parallel directions. The gas enters channel 128 wherein a plasma is generated and material is sputtered off of targets 90, 92. The resulting gaseous mixture includes target material atoms which are transported to the substrate. Reactive gas manifold 130 is positioned near the exit of channel 128. Reactive gas manifold 130 introduces a reactive gas that mixes with the gaseous mixture that includes the target atoms.

As set forth for the method described above, the source of non-laminarly flowing gas includes a series of orifices such that at least two gas streams emerging from the series of orifices are substantially flowing in non-parallel directions. The source of non-laminarly flowing gas includes a series of adjacent orifices that direct the gas in non-parallel directions. The channel defining surface will typically be part of the cathode. Moreover, the channel is characterized by a rectangular cross section. Again, as described above for the method, the sputter-coating system may have a first target material and a second target material. The first target material is preferably opposite the second where the first target material and the second target material are the same or different. In such a configuration, the two target materials will form at least a portion of the side walls of the channel-defining surface, and in particular the side walls that make up the wider sides when the channel has a rectangular cross section. Moreover, the at least one target material optionally includes a third target material and a fourth target material. The third target material being opposite the fourth target material. In this instance, the first target material, the second target material, the third target material, and the fourth target material may be the same or different. The target material, which is typically part of the cathode, is in electrical contact with a DC potential or a. DC potential with a superimposed AC potential. Moreover, the at least one target material comprises a metal or metal alloy. Suitable target materials include, but are not limited to, zinc, copper, aluminum, silicon, tin, indium, magnesium, titanium, chromium, molybdenum, nickel, yttrium, zirconium, niobium, cadmium, and mixtures thereof. The sputter-coating system of the present invention further comprises a source of a reactive gas which is located at proximate position to the exit of the channel.

The following examples illustrate the various embodiments of the present invention. Those skilled in the art will recognize many variations that are within the spirit of the present invention and scope of the claims.

EXAMPLE 1

Copper films were deposited in accordance to the method of the present invention at a power of 1000 W, a pressure of 400 mTorr, and an argon flow rate of 4 slm. The resistivities for a series of copper films for varying substrate conditions is provided in Table 1.

TABLE 1

Resistivity of copper films

| deposition conditions | film resistivity (microhm cm) |
|---|---|
| unheated substrate | 8.5 |
| bias −30 V, unheated substrate | 4.2 |
| bias −15 V, substrate 70° C. | 3.9 |
| substrate heated to 70° C. | 3.3 |
| bias −30 V, substrate 70° C. | 2.4 |

EXAMPLE 2

Figure 6:
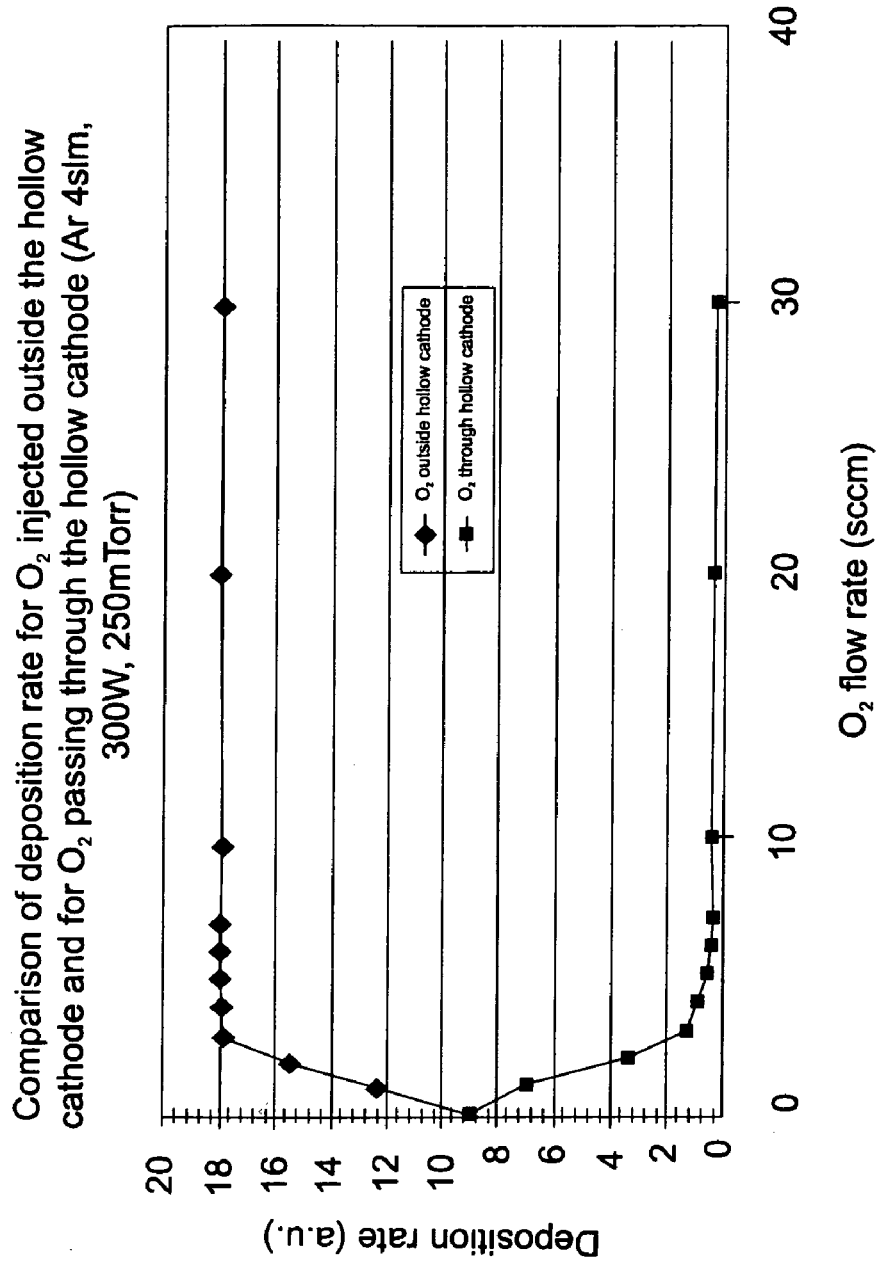
FIG. 6 is a plot of the deposition rate as a function of oxygen flow rate for aluminum oxide films deposited from an aluminum target by the method of the present invention operating with a power of 300 W, a pressure of 250 mTorr, and an argon flow rate of 4 slm for the cases of oxygen injection outside the cathode and oxygen passing through the cathode.

Aluminum oxide films were deposited by the method of the invention with a power of 300 W, a pressure of 250 mTorr, and an argon flow rate of 4 slm. The argon was injected using the arrangement of FIG. 1C. FIG. 6 is a plot of the deposition rate as a function of oxygen flow rate. The reactive gas $O_2$ is used here for two different cases: $O_2$ goes through the channel and $O_2$ is outside the channel. The deposition rate was measured by crystal monitor.

EXAMPLE 3

Figure 7:
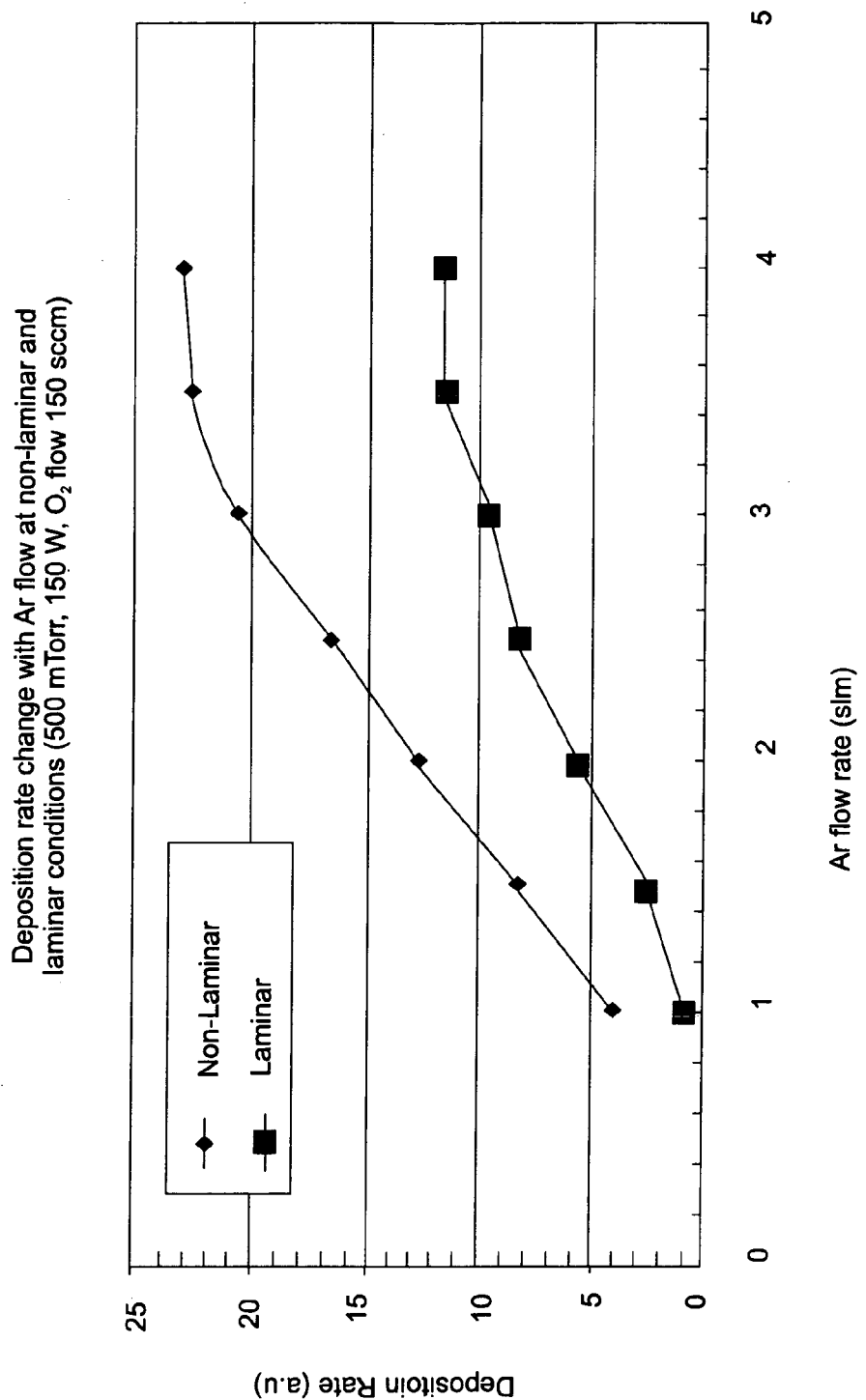
FIG. 7 is a plot of zinc oxide growth rate as a function of the argon flow rate for zinc oxide films deposited from a zinc target by the method of the invention operating with power of 150 W, a pressure of 500 mTorr, and an oxygen flow rate of 150 sccm.

Zinc oxide films were deposited by the method of the invention with power of 150 W, a pressure of 500 mTorr, and an oxygen flow rate of 150 sccm. FIG. 7 is a plot of zinc oxide growth rate as a function of the argon flow rate for deposition in a hollow cathode reactor where the argon is introduced non-turbulently and turbulently. In the case of turbulent flow, the film growth rate is observed to be significantly greater for all argon flow rates.

EXAMPLE 4

Aluminum doped zinc oxide films were deposited by the method of the invention with the conditions in Table 2. Table 3 provides a comparison for aluminum doped zinc oxide films made by the method of the present invention and by RF sputtering. Table 3 demonstrates that the method of the present invention is capable of depositing doped zinc oxide films with resistivities that are comparable to RF sputtering.

TABLE 2

Aluminum doped zinc oxide deposition conditions.

| Run | Power (W) | Pressure (mTorr) | oxygen flow rate (sccm) | target-substrate distance (cm) | resistivity ($10^{-3}$ ohm-cm) |
|---|---|---|---|---|---|
| 1 | 100 | 300 | 70 | 2.0 | 0.49 |
| 2 | 100 | 200 | 70 | 3.5 | 1.26 |
| 3 | 100 | 200 | 100 | 3.5 | 0.49 |
| 4 | 100 | 200 | 500 | 3.5 | 48 |
| 5 | 100 | 200 | 140 | 3.5 | 1.5 |
| 6 | 100 | 100 | 150 | 5.5 | 5.9 |
| 7 | 100 | 100 | 250 | 5.5 | large |
| 8 | 250 | 300 | 100 | 2.5 | 1.2 |

TABLE 3

Aluminum doped zinc oxide properties.

| Run | method | sheet resistance (Ω/□) | thickness (μm) | resistivity ($10^{-3}$ Ω-cm) |
|---|---|---|---|---|
| 1 | hollow cathode | 13 | 0.38 | 0.49 |
| 2 | hollow cathode | 23 | 0.52 | 1.19 |
| 3 | hollow cathode | 14 | 0.9 | 1.26 |
| 4 | RF magnetron | 5 | 0.89 | 0.45 |
| 5 | RF magnetron | 16 | 0.43 | 0.69 |
| 6 | RF magnetron | 14 | 0.63 | 0.88 |

EXAMPLE 5

Figure 8:
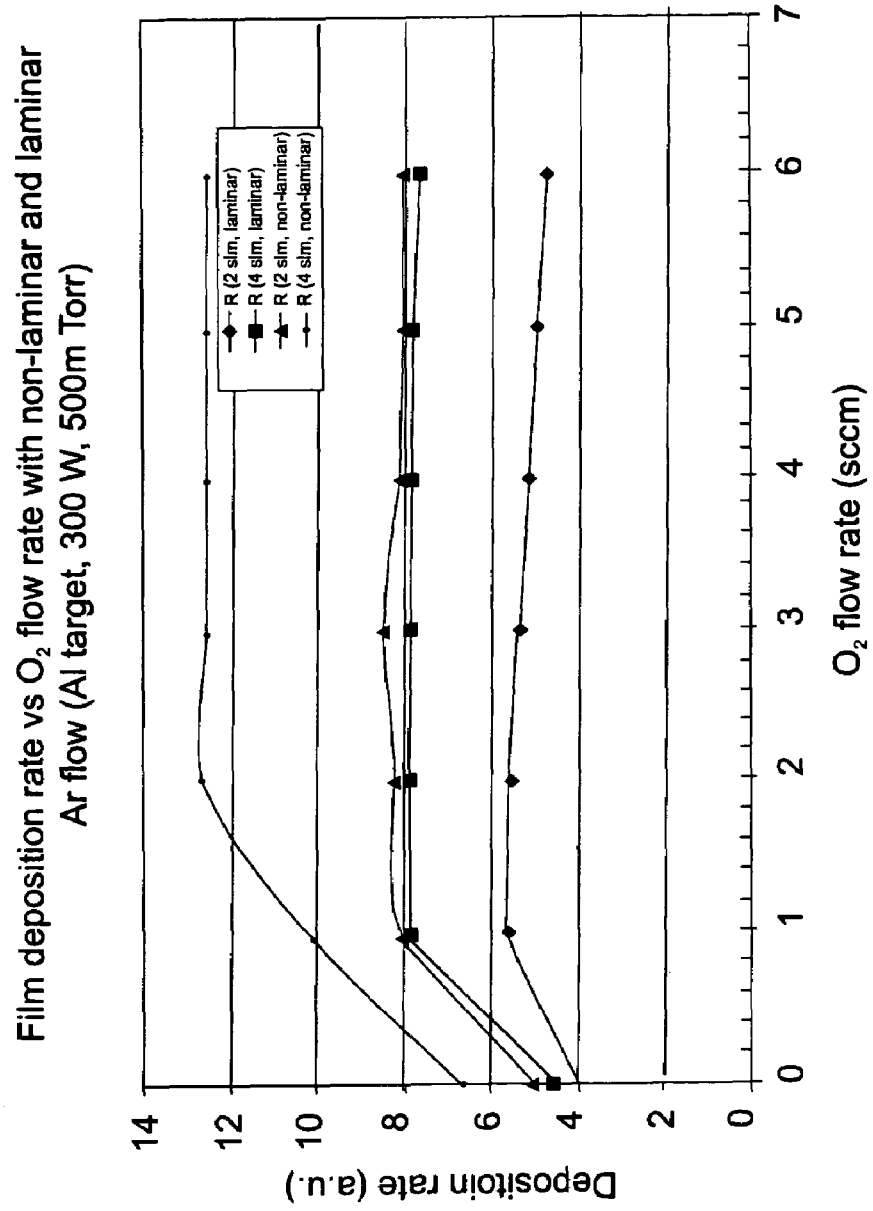
FIG. 8 is a plot of the deposition rate of aluminum oxide films as a function of oxygen flow rate for non-laminar and laminar flow by the method of the present invention operating at a power of 300 W, a pressure of 500 mTorr, and argon flow rates of 2 slm and 4 slm. The oxygen is injected outside the cathode.

Aluminum and aluminum oxide films were deposited by the method of the invention with a power of 300 W, a pressure of 500 mTorr, and argon flow rates of 2 slm and 4 slm. FIG. 8 is a plot of the aluminum oxide deposition rate as a function of oxygen flow rate for turbulent and non-turbulent Ar flow. For non-laminar flow, the gas injector is the type in FIG. 1C and for non-turbulent flow, the gas injector is the type of FIG. 1A. Again, the growth rates for all oxygen flow rates is observed to be significantly higher with turbulent Ar flow. Even for zero oxygen flow, the deposition rate of pure Al is enhanced by turbulent flow. With the addition of oxygen, the deposited mass rate increases because of oxygen incorporation into the film. The mass rate saturates once a fully oxidized film is formed. The increase in deposition rate with turbulence is even greater for aluminum oxide than for pure aluminum. This rate enhancement is of considerable technological importance. At the lower Ar flow (2 slm) the deposition rate without turbulent Ar flow is seen to decline with increasing oxygen flow. This is believed to result from partial penetration of oxygen into the cathode, resulting in partial oxidation of the target surface. With turbulent Ar flow, the deposition rate is independent of oxygen flow. This suggests that turbulence, as well as increasing the mass of Al that can be moved out of the cathode, also hinders the back-diffusion of oxygen into the cathode.

EXAMPLE 6

The transparent conductor ZnO:B was deposited by the method of the invention using zinc target pieces, turbulent Ar gas injection (type (c)), an Ar gas flow rate of 2 slm, a power of 300 W, a pressure of 300 mTorr, 120 sccm $O_2$ supplied from a manifold external to the cathode and directed at the substrate, and 2 sccm $B_2H_6$ gas passing through the cathode and mixed with the Ar. The deposition rate was 20 A/s and the film resistivity was $1.8 \times 10^{-3}$ ohm cm.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for sputter coating a substrate in a sputter coating reactor, the method comprising:
   a) providing a channel for gas to flow through, the channel defined by a channel defining surface wherein one or more portions of the channel-defining surface include at least one target material;
   b) flowing gas through the channel wherein at least a portion of the gas is a turbulently flowing gas with a Reynolds number greater than 2000, the gas flowing from a manifold placed within the channel; and
   c) generating a plasma, wherein the target material is sputtered off the channel-defining surface to form a gaseous mixture containing target atoms that are transported to the substrate.

2. The method of claim 1 wherein the turbulently flowing gas is formed by flowing a first portion of gas in a first direction and a second portion of gas in a second direction wherein the first direction and the second direction are substantially non-parallel.

3. The method of claim 1 wherein the turbulently flowing gas is formed by flowing the gas through at least two orifices such that at least two gas streams emerging from the at least two orifices are flowing in substantially non-parallel directions.

4. The method of claim 1 wherein the turbulently flowing gas is formed flowing the gas through a series of orifices such that adjacent orifices direct the gas in non-parallel directions.

5. The method of claim 1 wherein the channel-defining surface is part of a cathode.

6. The method of claim 1 wherein the channel has a rectangular cross section.

7. The method of claim 1 wherein the target material is in electrical contact with a DC potential, a DC potential with a superimposed AC potential, or a pulsed DC potential.

8. The method of claim 1 wherein the target material is in electrical contact with a pulsed DC power source that is an asymmetric bipolar pulsed DC power supply.

9. The method of claim 1 wherein the at least one target material comprises a metal or metal alloy.

10. The method of claim 1 wherein the at least one target material comprises a component selected from the group consisting of zinc, copper, aluminum, silicon, tin, indium, magnesium, titanium, chromium, molybdenum, nickel, yttrium, zirconium, niobium, cadmium, and mixtures thereof.

11. The method of claim 1 wherein the at least one target material includes a first target material and a second target material, the first target material being opposite the second and wherein the first target material and the second target material are the same or different.

12. The method of claim 11 wherein the first target material and the second target material comprise a metal or a metal alloy.

13. The method of claim 11 wherein the first target material and the second target material independently include a component selected from the group consisting of zinc, copper, aluminum, silicon, tin, indium, magnesium, titanium, chromium, molybdenum, nickel, yttrium, zirconium, niobium, cadmium, and mixtures thereof.

14. The method of claim 11 wherein the at least one target material includes a third target material and a fourth target material, the third target material being opposite the fourth target material and wherein the first target material, the second target material, the third target material, and the fourth target material are the same or different.

15. The method of claim 11 wherein the at least one target material includes a first electrically insulating block and a second electrically insulating block, the first insulating block being opposite the second insulating block.

16. The method of claim 11 further comprising introducing a reactive gas into the sputter coating reactor.

17. The method of claim 16 wherein the reactive gas is introduced at a position located outside of the channel from which the gaseous mixture emerges.

18. The method of claim 16 wherein the reactive gas contains an atom selected from the group consisting of oxygen, nitrogen, selenium, sulfur, iodine, hydrogen, carbon, boron, and phosphorus.

19. The method of claim 16 wherein the reactive gas is selected from the group consisting of molecular oxygen, molecular nitrogen, molecular hydrogen, H2O, $H_2Se$, $CH_4$, $C_2H_6$, $C_2H_2$, $C_2H_4$, $B_2H_6$, $PH_3$, $CCl_4$, $CF_4$, HMDSO, pyrrole and mix thereof.

20. A method for depositing an oxide film on a substrate in a sputter coating reactor, the method comprising:
   a) providing a channel for a working gas to flow through, the channel defined by a channel-defining surface wherein one or more portions of the channel-defining surface include at least one target material;
   b) flowing the working gas through the channel wherein at least a portion of the working gas flows turbulently with a Reynolds number greater than 2000, the working gas flowing from a manifold placed within the channel;

c) generating a plasma wherein a portion of the target material is sputtered off the at least one target material to form a gaseous mixture containing target atoms; and d) introducing into the sputter coating reactor a reactive gas comprising oxygen, wherein an oxide film is deposited on the substrate.

21. The method of claim 20 wherein the reactive gas is introduced at a position located outside of the channel from which the gaseous mixture emerges.

22. The method of claim 20 wherein the at least one target material comprises a metal, metal alloy, or semiconductor.

23. The method of claim 20 wherein the at least one target material comprises a component selected from the group consisting of zinc, copper, aluminum, silicon, tin, indium, magnesium, titanium, chromium, molybdenum, nickel, yttrium, zirconium, niobium, cadmium, and mixtures thereof.

24. The method of claim 20 wherein the oxide film is CrSiOx, ZnO:B (boron doped zinc oxide), $CuAlO_2$, $CuBO_2$, $In_2O_3$, $In_2O_3$:Mo, ITO, MgO, $Al_2O_3$ or mixtures thereof.

25. The method of claim 20 wherein the at least one target material comprises zinc and the oxide film is zinc oxide.

26. The method of claim 25 wherein the at least one target material further comprises aluminum.

27. The method of claim 20 wherein the reactive gas contains oxygen atoms.

28. The method of claim 20 wherein the reactive gas is molecular oxygen or $H_2O$.

29. The method of claim 20 wherein the at least one target material includes a first target material and a second target material; and the first target material and the second target material are the same or different.

30. The method of claim 29 wherein the first target material is opposite the second target material.

31. The method of claim 29 wherein the first target material and the second target material comprise a metal or a metal alloy.

32. The method of claim 29 wherein the first target material and the second target material independently comprise a component selected from the group consisting of zinc, copper, aluminum, silicon, tin, indium, magnesium, titanium, chromium, molybdenum, nickel, yttrium, zirconium, niobium, cadmium, and mixtures thereof.

33. The method of claim 29 wherein the first target material comprises zinc and the second target comprises aluminum wherein the oxide film is aluminum-doped zinc oxide.

34. A sputter-coating system for coating a substrate, the sputter-coating system comprising:

at least one target material an electrode having a channel-defining surface that defines a channel wherein one or more portions of the channel-defining surface contains the at least one target material;

a source of non-laminarly flowing working gas, the working gas flowing from a manifold placed within the channel such that at least a portion of the working gas flows turbulently with a Reynolds number greater than 2000; wherein during operation of the sputter-coating system a plasma is generated whereby the at least one target material is sputtered off the channel-defining surface to form a gaseous reactive composition that is transported to the substrate.

35. The sputter-coating system of claim 34 wherein the source of non-laminarly flowing gas includes a series of orifices such that at least two gas streams emerging from the series of orifices are substantially flowing in non-parallel directions.

36. The sputter-coating system of claim 34 wherein the source of non-laminarly flowing gas includes a series of orifices such adjacent orifice direct the gas in non-parallel directions.

37. The sputter-coating system of claim 34 wherein the enclosing surface is part of a cathode.

38. The sputter-coating system of claim 34 wherein the channel is characterized by a rectangular cross section.

39. The sputter-coating system of claim 34 wherein the at least one target material includes a first target material and a second target material, the first target material being opposite the second and wherein the first target material and the second target material are the same or different.

40. The sputter-coating system of claim 39 wherein the first target material and the second target material comprise a metal or a metal alloy.

41. The sputter-coating system of claim 39 wherein the first target material and the second target material individually include a component selected from the group consisting of zinc, copper, aluminum, silicon, tin, indium, magnesium, titanium, chromium, molybdenum, nickel, yttrium, zirconium, niobium, cadmium, and mixtures thereof.

42. The sputter-coating system of claim 39 wherein the at least one target material includes a third target material and a fourth target material, the third target material being opposite the fourth target material and wherein the first target material, the second target material, the third target material, and the fourth target material are the same or different.

43. The sputter-coating system of claim 34 further comprising a source of a reactive gas.

44. The sputter-coating system of claim 43 wherein the source of a reactive gas is located at proximate position to the exit of the channel.

45. A method for depositing nitride film on a substrate in a sputter coating reactor, the method comprising:

a) providing a channel for a working gas to flow through, the channel defined by a channel-defining surface wherein one or more portions of the channel-defining surface include at least one target material;

b) flowing the working gas through the channel wherein at least a portion of the working gas flows turbulently with a Reynolds number greater than 2000, the gas flowing from a manifold placed within the channel, the working gas flowing from a manifold placed within the channel;

c) generating a plasma wherein a portion of the target material is sputtered off the at least one target material to form a gaseous mixture containing target atoms; and d) introducing into the sputter coating reactor a reactive gas comprising molecular nitrogen, wherein a nitride film is deposited on the substrate.

46. The method of claim 45 wherein the reactive gas is combined with the working gas while it is flowed through the channel.

47. The method of claim 45 wherein the reactive gas is introduced at a position located outside of the channel from which the gaseous mixture emerges.

48. The method of claim 45 wherein the at least one target material comprises a metal, metal alloy, or semiconductor.

49. The method of claim 45 wherein the at least one target material comprises a component selected from the group consisting of zinc, copper, aluminum, silicon, tin, indium, magnesium, titanium, chromium, molybdenum, nickel, yttrium, zirconium, niobium, cadmium, vanadium, hafnium, tungsten, and mixtures thereof.

50. The method of claim 45 wherein the nitride film is titanium nitride, indium nitride, aluminum nitride, chromium nitride, vanadium nitride, zirconium nitride, tungsten nitride, copper nitride, or mixtures thereof.

51. The method of claim 45 wherein the at least one target material includes a first target material and a second target material; and the first target material and the second target material are the same or different.

52. The method of claim 51 wherein the first target material is opposite the second target material.

* * * * *